(12) United States Patent
Kamiyama et al.

(10) Patent No.: US 11,211,526 B2
(45) Date of Patent: Dec. 28, 2021

(54) SEMICONDUCTOR LIGHT-EMITTING ELEMENT

(71) Applicants: TOSHIBA MATERIALS CO., LTD., Yokohama (JP); Meijo University, Nagoya (JP)

(72) Inventors: Satoshi Kamiyama, Nagoya (JP); Atsuya Sasaki, Yokohama Kanagawa (JP); Ryosuke Hiramatsu, Yokohama Kanagawa (JP); Hideaki Hirabayashi, Yokohama Kanagawa (JP)

(73) Assignees: TOSHIBA MATERIALS CO., LTD., Yokohama (JP); MEIJO UNIVERSITY, Nagoya (JP)

( * ) Notice: Subject to any disclaimer, the term of this patent is extended or adjusted under 35 U.S.C. 154(b) by 0 days.

(21) Appl. No.: 16/572,468

(22) Filed: Sep. 16, 2019

(65) Prior Publication Data

US 2020/0013924 A1  Jan. 9, 2020

Related U.S. Application Data

(63) Continuation of application No. PCT/JP2018/010863, filed on Mar. 19, 2018.

(30) Foreign Application Priority Data

Mar. 28, 2017  (JP) .............................. JP2017-062990

(51) Int. Cl.
*H01L 33/22* (2010.01)
*H01L 33/46* (2010.01)
*H01L 33/60* (2010.01)

(52) U.S. Cl.
CPC .............. *H01L 33/22* (2013.01); *H01L 33/46* (2013.01); *H01L 33/60* (2013.01)

(58) Field of Classification Search
CPC .......... H01L 33/22; H01L 33/60; H01L 33/46
See application file for complete search history.

(56) References Cited

U.S. PATENT DOCUMENTS

| 5,226,053 | A | 7/1993 | Cho et al. | |
|---|---|---|---|---|
| 8,658,450 | B2 * | 2/2014 | Nago .................. | H01L 21/0254 438/46 |
| 8,963,183 | B2 * | 2/2015 | Suh ........................ | H01L 33/50 257/98 |

(Continued)

FOREIGN PATENT DOCUMENTS

| JP | 2007-081368 A | 3/2007 |
|---|---|---|
| JP | 2011-109094 A | 6/2011 |

(Continued)

*Primary Examiner* — Savitri Mulpuri
(74) *Attorney, Agent, or Firm* — Foley & Lardner LLP

(57) ABSTRACT

A semiconductor light-emitting element having an emission peak wavelength of 395 nm or more and 425 nm or less, comprises: a substrate including a first surface and a second surface, at least one surface selected from the group consisting of the first and second surfaces having an uneven region; a semiconductor layer on the first surface; and a multilayer reflective film on the second surface or the semiconductor layer, wherein the multilayer reflective film includes a structure having a plurality of first dielectric films and a plurality of second dielectric films, the first dielectric films and the second dielectric films being alternately stacked.

17 Claims, 3 Drawing Sheets

(56) References Cited

U.S. PATENT DOCUMENTS

| | | |
|---|---|---|
| 2008/0048194 A1 | 2/2008 | Kudo et al. |
| 2011/0114969 A1 | 5/2011 | Lee et al. |
| 2012/0025244 A1 | 2/2012 | Suh et al. |
| 2013/0058102 A1 | 3/2013 | Lin |
| 2013/0240937 A1* | 9/2013 | Chae .................. H01L 33/46 257/98 |
| 2013/0307011 A1 | 11/2013 | Yamakawa et al. |
| 2016/0013383 A1 | 1/2016 | Wu et al. |

FOREIGN PATENT DOCUMENTS

| | | |
|---|---|---|
| JP | 2014-524674 A | 9/2014 |
| JP | 5823416 B2 | 11/2015 |
| JP | 2016-001740 A | 1/2016 |
| JP | 2016-146407 A | 8/2016 |
| JP | 2016-201525 A | 12/2016 |
| KR | 10-1993-0015124 | 7/1993 |
| KR | 10-2012-0014750 | 2/2012 |
| WO | WO-2012/015153 A2 | 2/2012 |
| WO | WO-2014/058069 A1 | 4/2014 |

\* cited by examiner

SEMICONDUCTOR LIGHT-EMITTING ELEMENT

CROSS-REFERENCE TO RELATED APPLICATIONS

This application is a continuation of prior International Application No. PCT/JP2018/010863 filed on Mar. 19, 2017; the entire contents of all of which are incorporated herein by reference.

FIELD

Embodiments of the present invention relate to a semiconductor light-emitting element.

BACKGROUND

A semiconductor light-emitting element such as a light-emitting diode (LED) has been widely used for extending life and saving energy. A semiconductor light-emitting element having various emission peaks has been developed by improving a semiconductor active layer. A general light-emitting diode emits any monochromic light from among blue, green or red. A combination of the blue LED and a phosphor can form white light. A white LED using the blue LED is called a simulated white LED, and has low reproducibility of natural light (sunlight). Natural white light is formed by mixing a blue component, a green component, and a red component. The reproducibility by the semiconductor light-emitting element using the blue LED is limited because the element has a blue peak different from the natural light.

Alternatively, the natural light has been experimentally reproduced by a blue-violet LED. An emission peak of the blue-violet LED is at around 400 nm. This LED is combined with various phosphors such as a blue phosphor, a green phosphor, and a red phosphor to reproduce the natural light. Known examples of reproducing the natural light includes reproducing the natural light by combining the LED having the emission peak wavelength at around 400 nm with the phosphors. An use of the blue-violet LED can form the white LED reproducing the natural light.

Unfortunately, the blue-violet LED can have insufficient light-emission output. The insufficient light-emission output of the blue-violet LED prevents an increase of light-emission output of the white LED. Known examples of increasing the light-emission output of the white LED include using a multilayer reflective film. The multilayer reflective film increases reflectivity at around 360 nm to approximately 95%. The multilayer reflective film increases the reflectivity at around 500 nm.

The multilayer reflective film can increase the reflectivity at a specific wavelength. This improves light-emission efficiency of the LED. Unfortunately, the application of the multilayer reflective film to the blue-violet LED can prevent the improvement in the reflectivity. This limits the improvement of the light-emission output of the blue-violet LED.

DETAILED DESCRIPTION

A semiconductor light-emitting element having an emission peak wavelength of 395 nm or more and 425 nm or less, comprises: a substrate including a first surface and a second surface, at least one surface selected from the group consisting of the first and second surfaces having an uneven region; a semiconductor layer on the first surface; and a multilayer reflective film on the second surface or the semiconductor layer, wherein the multilayer reflective film includes a structure having a plurality of first dielectric films and a plurality of second dielectric films, the first dielectric films and the second dielectric films being alternately stacked.

Figure 1:
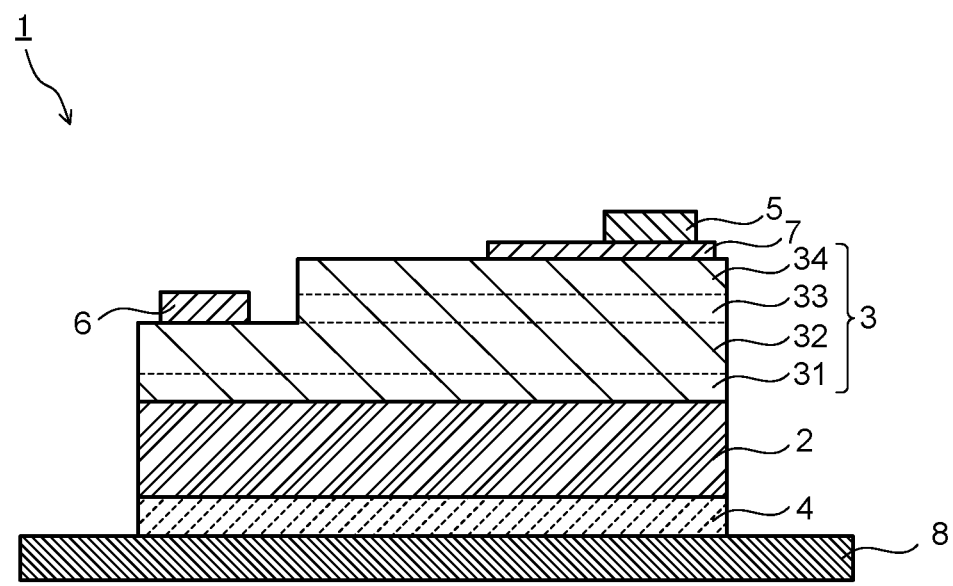
FIG. 1 is a cross-sectional schematic diagram illustrating a structural example of a semiconductor light-emitting element.

FIG. 1 is a cross-sectional schematic diagram illustrating a structural example of a semiconductor light-emitting element. A semiconductor light-emitting element 1 illustrated in FIG. 1 includes a substrate 2, a semiconductor layer 3, a multilayer reflective film 4, an electrode 5 (a p-pad electrode), an electrode 6 (an n-pad electrode), a translucent electrode 7, and a mounting substrate 8. FIG. 1 exemplifies a face-up semiconductor light-emitting element, but the semiconductor light-emitting element according to the embodiment is not limited to the face-up type and may be a flip-chip semiconductor light-emitting element.

An emission peak wavelength of the semiconductor light-emitting element 1 is in a range of 395 nm or more and 425 nm or less. A wavelength region of less than 395 nm is an ultraviolet region. A wavelength region of over 425 nm is a blue region. The wavelength region of 395 nm or more and 425 nm or less is a blue-violet region. The emission peak wavelength is more preferably in a range of 400 nm or more and 420 nm or less.

The semiconductor layer 3 is disposed on a top surface (first surface) of the substrate 2. That is, the semiconductor layer 3 is disposed on the surface where the light-emitting layer is mounted. A structure of the semiconductor layer 3 is not particularly limited as long as the emission peak wavelength is in the range of 395 nm to 425 nm. The semiconductor layer 3 preferably has a buffer layer 31, an n-type layer 32, an active layer 33, and a p-type layer 34 as illustrated in FIG. 1.

The buffer layer 31 is provided so as to improve crystallinity of the semiconductor layer such as the active layer 33 provided thereon. The buffer layer 31 preferably contains, for example, a gallium nitride (GaN)-based material, an aluminum nitride (AlN)-based material, or the like. The buffer layer 31 is provided as necessary.

The n-type layer 32 is an n-type semiconductor layer. Examples of the n-type semiconductor layer include an n-type cladding layer, a layer combining an n-type contact layer and the n-type cladding layer, and so on. Examples of the n-type cladding layer include a Si-doped GaN, AlGaN, and so on. An example of the n-type contact layer includes the Si-doped GaN, and so on.

The active layer 33 is a light-emitting layer. Examples of the light-emitting layer include an InGaN film, a GaN film, an InAlGaN film, an AlGaN film, or a stacked film where these are stacked, and so on. A relaxation layer may be provided between the active layer 33 and the n-type layer 32. Examples of the relaxation layer include the InGaN film, the GaN film, the InAlGaN film, the AlGaN film, or a superlattice layer where these are stacked, and so on The p-type layer 34 is a p-type semiconductor layer. Examples of the p-type semiconductor layer include a p-type contact layer, a p-type cladding layer, or a layer combining the p-type contact layer and the p-type cladding layer, and so on. An example of the p-type contact layer includes an impurity element-doped GaN layer, or the like. An example of the impurity element includes magnesium (Mg), and so on. Examples of the p-type cladding layer include the impurity element-doped GaN layer, an AlGaN layer, and so on.

The semiconductor layer 3 has a multilayer structure. A carrier of the n-type semiconductor layer is an electron, and a carrier of the p-type semiconductor layer is a hole. The electron and the hole collided and disappeared each other in a pn junction part to occur recombination. The recombination emits energy as light, the energy corresponding to a difference between energy of the electron and energy of the hole. It is possible to efficiently accumulate the electrons and the holes by not directly joining the p-type layer 34 and the n-type layer 32 but by making the semiconductor layer 3 have the multilayer structure by providing another layer. This improves light-emission efficiency. In other words, when the multilayer structure is not a homogeneous structure, a deviation is likely to occur in the emission peak wavelength.

The electrode 5 and the electrode 6 are provided on the semiconductor layer 3. A translucent electrode may be provided between the semiconductor layer 3 and the electrode 5, or between the semiconductor layer 3 and the electrode 6 as necessary. In FIG. 1, the translucent electrode 7 is provided between the semiconductor layer 3 and the electrode 5, but it may be provided under the electrode 6. In FIG. 1, the electrode 5 becomes the p-pad electrode, and the electrode 6 becomes the n-pad electrode. The electrode 5 and the electrode 6 can be electrically connected to other components through wire bonding.

Examples of the electrode 5 and the electrode 6 include an Au film, an Au alloy film, an Au/Ti stacked film, an Au/Pd stacked film, an Au/Al stacked film, an Ni/Pd stacked film, an Au/Ni stacked film, and so on. These electrodes have good adhesiveness with a bonding wire. The translucent electrode 7 is preferably a film transmitting light. Examples of the translucent electrode include an indium-tin-oxide (ITO) film, an indium-zinc-oxide (IZO) film, a zinc oxide film, a tin oxide film, and so on.

A protection film may be provided on the semiconductor layer 3 though it is not illustrated. Examples of the protection film include an oxide film such as a silicon oxide film, and a nitride film such as a silicon nitride film. The protection film may be provided to cover not only the semiconductor layer 3 but also a whole of the semiconductor light-emitting element 1.

Figure 2:
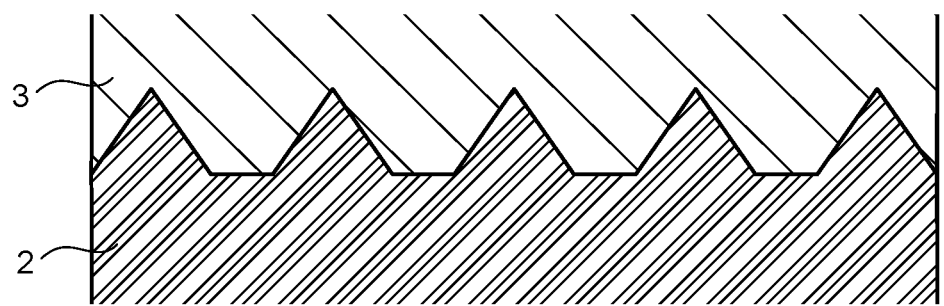
FIG. 2 is a cross-sectional schematic diagram illustrating a structural example of a substrate.

The semiconductor layer 3 is provided on the substrate 2. Examples of the substrate 2 include various substrates such as, for example, a sapphire substrate, a SiC substrate, and a GaN substrate. The substrate 2 has fine uneven surface on at least one of the top surface (first surface) side or a bottom surface (second surface) side. An example of the fine uneven surface is illustrated in FIG. 2. FIG. 2 illustrates the substrate 2 and the semiconductor layer 3. FIG. 2 illustrates a structure where the fine uneven surface is provided on the top surface of the substrate 2, that is, a side where the semiconductor layer 3 is formed. An effect of reflecting light can be obtained by providing the fine uneven surface. The light from the active layer 33 includes light going out of the light-emitting element and light heading inside the element. The light-emission output of the light-emitting element can be improved by reflecting the light heading inside the element to go out of the element.

The fine uneven surface preferably have protrusions on the substrate 2. Examples of the shape of the protrusions include a conical shape and a polygonal pyramid shape. The preferable shape of the protrusions is a polygon having a triangle cross-section and a trapezoid cross-section. The protrusions having a slope improve a reflection effect. The protrusions are preferably periodically provided. A sapphire substrate provided with the fine uneven surface is called a patterned sapphire substrate (PSS). The protrusions in the fine uneven surface preferably have a diameter of 0.5 to 5 μm, height of 0.5 to 5 μm, and a pitch 0.5 to 5 μm. The pitch is defined by a distance between vertexes of adjacent protrusions. When a tip of the protrusion is a planar shape (the cross-section of the protrusion is the trapezoid), a distance between centers of planes at the tips is set as the pitch. The protrusions having size outside the above-stated range can cause the insufficient reflection effect and a insufficient light-taking-out effect.

Figure 3:
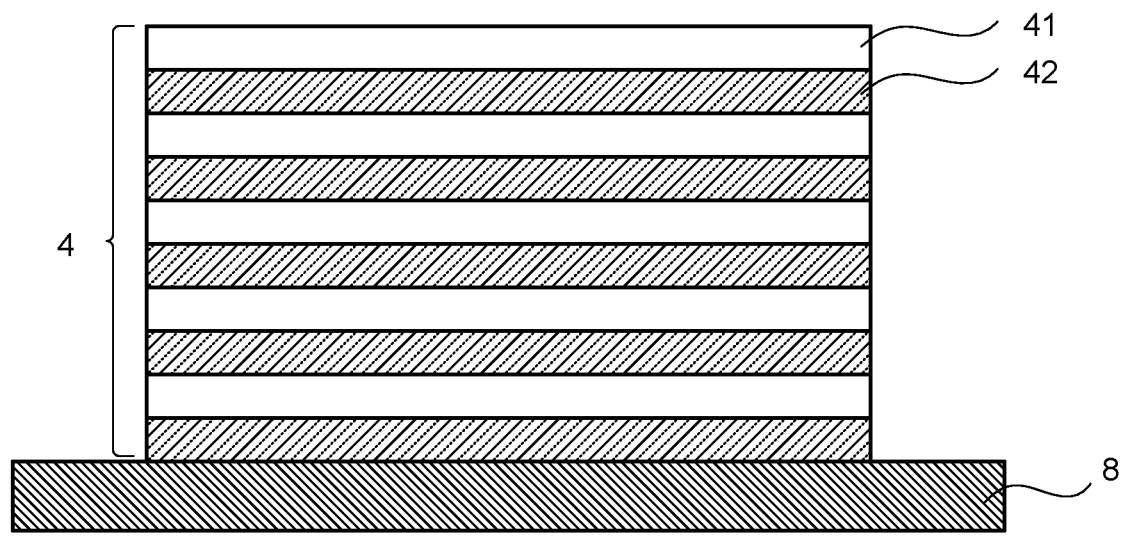
FIG. 3 is a cross-sectional schematic diagram illustrating a structural example of a multilayer reflective film.
Figure 4:
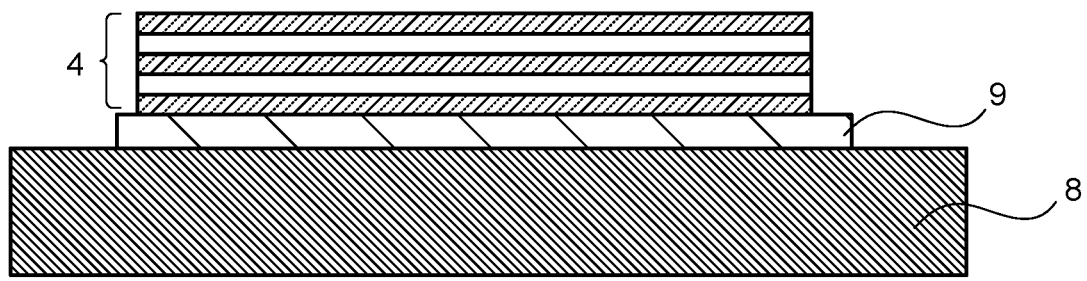
FIG. 4 is a cross-sectional schematic diagram illustrating another structural example of the semiconductor light-emitting element.

The multilayer reflective film 4 is provided on a bottom surface (a second surface) of the substrate 2, the multilayer reflective film 4 having a structure where first dielectric films and second dielectric films are alternately stacked. The bottom surface is disposed on an opposite surface of the surface where the semiconductor layer 3 is provided from the substrate 2. FIG. 3 illustrates a cross-sectional diagram exemplifying the multilayer reflective film. FIG. 4 illustrates first dielectric films 41, second dielectric films 42, and the mounting substrate 8. As described later, a case of the flip-chip type element has the substrate 2, the semiconductor layer 3, the multilayer reflective film 4, each being laminated in sequence.

The multilayer reflective film 4 is a multilayer film where the first dielectric films 41 and the second dielectric films 42 are alternately stacked. The reflectivity can be improved by alternately stacking the first dielectric film 41 and the second dielectric film 42 each having different refractive indexes.

The number of stacks is preferably three or more. The number of stacks is defined by the number of stacked pairs, each pair having one of the first dielectric films 41 and one of the second dielectric films 42. For example, if the multilayer reflective film 4 has the first dielectric film 41, the second dielectric film 42, the first dielectric film 41, and the second dielectric film 42, the number of the stacks is two times. A structure where the first dielectric films 41 and the second dielectric films 42 are alternately stacked five times or more indicates a multilayer reflective film where the pair of the first dielectric film 41 and the second dielectric film 42 is stacked three times or more. The reflectivity of light can be improved by alternately stacking the films. An upper limit of the number of stacks is not particularly limited, but it is preferably 50 or less. When it exceeds 50, an effect of the reflectivity improvement becomes small, and cost increases. The number of stacks can be set to 30 or less by using a later-described metal reflective film 9. It is good as long as there is one set or more of wavelengths λ1 and λ2 satisfying the following formulas 1 to 6.

When a refractive index of the first dielectric film 41 is set as n1 and a film thickness thereof is set as d1 (nm), a refractive index of the second dielectric film 42 is set as n2 and a film thickness thereof is set as d2 (nm), a relation between the arbitrary wavelength λ1 in a wavelength range of 380 to 430 nm and the arbitrary wavelength λ2 in the wavelength range of 380 to 430 nm preferably satisfies the following formulas 1 to 6.

$$0.9(\lambda 1/(4 \times n1)) \leq d1 \leq 1.1(\lambda 1/(4 \times n1)) \quad \text{A formula 1:}$$

$$0.9(\lambda 2/(4 \times n2)) \leq d2 \leq 1.1(\lambda 2/(4 \times n2)) \quad \text{A formula 2:}$$

$$n1 > n2 \quad \text{A formula 3:}$$

$$20 \leq |\lambda 1 - \lambda 2| \quad \text{A formula 4:}$$

$$380 \leq \lambda 1 \leq 430 \quad \text{A formula 5:}$$

$$380 \leq \lambda 2 \leq 430 \quad \text{A formula 6:}$$

Since n1>n2, the refractive index n1 of the first dielectric film 41 is larger than the refractive index n2 of the second dielectric film 42.

The wavelengths λ1 (nm) and λ2 (nm) are arbitrary wavelengths selected from 380 to 430 nm. The λ1 and the λ2 have the relation of 20≤|λ−λ2|. First, the λ1 (nm) is fixed from 380 to 430 nm. A target of the λ2 is all wavelengths in a range satisfying 20≤|λ1−λ2| (nm) and 380≤λ2≤430 (nm). For example, when the λ1 is 405 nm, the λ2 is 380 to 385 nm and 425 to 430 nm.

When a film thickness of the reflective film is set as d (nm), a refractive index of the reflective film is set as n, and a peak wavelength of the light-emitting element is set as λp (nm), design is made such that the film thickness d=λp/(4×n). The peak wavelength λp of the light-emitting element is set as a reference because it is the light which is desired to be reflected. A quarter wavelength of the light which is to be reflected is set as the reference of the film thickness. When light is incident from a high-refractive-index medium to a low-refractive-index medium, a phase of a reflected wave does not change at a boundary surface, but when light is incident from the low-refractive-index medium to the high-refractive-index medium, the phase of the reflected wave changes for π (180°: corresponding to λ/2 wavelength) at the boundary surface by designing the reflective film as stated above. Accordingly, it is possible to obtain high reflectivity by alternately and periodically arranging respective media while setting the film thickness of each medium to have a quarter optical thickness of the wavelength λ because the phases of the reflected waves from respective boundary surfaces are thereby aligned. Accordingly, the film thickness d=λp/(4×n) of the reflective film is thought to be a theoretical value (an ideal reflective film).

On the other hand, the multilayer reflective film according to the embodiment sets the arbitrary wavelengths in the range of 380 to 430 nm as the λ1 and the λ2. The λ1 can be arbitrary selected as long as it is in the range. The λ2 is in the range satisfying both 20≤|λ1−λ2| and 380≤λ2≤430. In addition, the film thicknesses are controlled such that 0.9 (λ1/(4×n1)≤d1≤1.1 (λ1/(4×n1)) and 0.9 (λ2/(4×n2))≤d2≤1.1 (λ2/(4×n2)) are satisfied. There is a difference of at least 20 nm between the λ1 and the λ2 because 20≤|λ1−λ2| is satisfied. The multilayer reflective film of the embodiment sets two kinds of wavelengths which are to be reflected. It is thereby possible to improve the reflectivity in the range of 380 to 430 nm. The emission peak wavelength of the semiconductor light-emitting element according to the embodiment is in the range of 395 to 425 nm. Meanwhile, the multilayer reflective film capable of improving the reflectivity in the range of 380 to 430 nm is formed.

The film thickness d of the reflective film of the semiconductor light-emitting element such as the LED is designed while using the emission peak wavelength λp as the reference (the reflective film thickness d=λp/(4×n)) as stated above. Meanwhile, in the blue-violet LED whose emission peak wavelength is from 395 to 425 nm, the emission peak includes from an ultraviolet region to a visible light region because a predetermined full width at half maximum is held. The reflectivity in the range of 380 to 430 nm can be improved by forming the multilayer reflective film using the two wavelengths of the λ1 and the λ2 as the references.

On the other hand, only the reflectivity at the peak wavelength was improved in a reflective film fabricated based on only the theoretical value (the reflective film thickness d=λp/(4×n)), and the improvement in the reflectivity was insufficient. The peak wavelength of the LED is likely to deviate for approximately 5 to 15 nm depending on manufacturing variance thereof. When the reflective film is designed in accordance with the theoretical value of an objected peak wavelength, the reflectivity decreases if the peak wavelength slightly deviates. The light-emission output of the light-emitting element thereby decreases. The reflectivity can be increased even when the peak wavelength deviates by designing the reflective film so as to improve the reflectivity at 380 to 430 nm like the embodiment. That is, the light-emission output can be increased even if the peak wavelength of the semiconductor light-emitting element deviates. It is not necessary to design by each wavelength, and a semiconductor light-emitting device which is low in cost and high in light-emission intensity can be manufactured by including the reflective film according to the embodiment.

When the emission peak wavelength is set as λp (nm), the thickness of another one of the first dielectric films 41 is preferably different from a value of the film thickness d1 (nm) defined by A formula 7: d1=λp/(4×n1), the difference therebetween being preferably 1 nm or more. When the emission peak wavelength is set as λp (nm), the thickness of the another one of the second dielectric films 42 is different from a value of the film thickness d2 (nm) defined by A formula 8: d2=λp/(4×n2), the difference therebetween being preferably 1 nm or more.

As mentioned above, the film thickness of the reflective film is designed while using d=λp/(4×n) as the reference value. This reference value is regarded as an optimum theoretical value. In the multilayer reflective film 4, it is indicated that at least one dielectric film has the film thickness deviated from the theoretical value when the first dielectric films 41 and the second dielectric films 42 are alternately stacked. The deviation from the theoretical value is 1 nm or more means a state where the film thickness is either thicker or thinner than the theoretical value for 1 nm or more. The film thickness deviated from the theoretical value enables to further improve the reflectivity in the range of 380 to 430 nm. The deviation from the theoretical value is preferably 1 nm or more, and further preferably 3 nm or more.

The first dielectric films 41 preferably have the thickness variation of 5 nm or more. The second dielectric films 42 preferably have the thickness variation of 5 nm or more. The thickness variation of 5 nm or more in the first dielectric films 41 means that a difference in the film thicknesses of the first dielectric films 41 with each other is 5 nm or more. Similarly, the thickness variation of 5 nm or more in the second dielectric films 42 means that a difference in the film thicknesses of the second dielectric films 42 with each other is 5 nm or more.

The deviation from the theoretical value and the thickness variation can be applied to either one of or both of the first dielectric films 41 and the second dielectric films 42. It is the most preferable to apply to both the first dielectric films 41 and the second dielectric films 42.

The first dielectric film 41 preferably contains at least one selected from titanium oxide, zirconium oxide, silicon nitride, niobium oxide, and tantalum oxide. An example of the titanium oxide includes $TiO_2$, and so on. An example of the zirconium oxide includes $ZrO_2$, and so on. An example of the silicon nitride includes $Si_3N_4$, and so on. An example of the niobium oxide includes $Nb_2O_5$, and so on. The tantalum oxide is preferably at least one kind selected from $Ta_2O_5$. Since the titanium oxide ($TiO_2$), the zirconium oxide ($ZrO_2$), the silicon nitride ($Si_3N_4$), the niobium oxide ($Nb_2O_5$), and the tantalum oxide ($Ta_2O_5$) can be film-formed by a thin-film technology such as sputtering, and enables easy control of the film thickness.

The second dielectric film 42 preferably contains at least one selected from silicon oxide, magnesium fluoride, and calcium fluoride. An example of the silicon oxide includes $SiO_2$, and so on. An example of the magnesium fluoride includes MgF, and so on. An example of the calcium fluoride includes $CaF_2$, and so on. Since the silicon oxide ($SiO_2$), the magnesium fluoride (MgF), and the calcium fluoride ($CaF_2$) can be film-formed by the thin-film technology such as the sputtering, the control of the film thickness is likely to be performed. The above-stated materials enables easy adjustment of the refractive indexes between the first dielectric film 41 and the second dielectric film 42 so that the refractive indexes satisfies n1>n2.

The first dielectric film 41 preferably includes a dielectric film having a large difference in the refractive index between the dielectric film and the substrate 2. The refractive index of the sapphire substrate at around 380 to 430 nm is approximately 1.8. The relation satisfying n1>n2 increase the difference in the refractive index. This increases the reflectivity of light through the substrate 2. The difference in the refractive indexes between the first dielectric film 41 and the second dielectric film 42 is preferably large. Another layer may be provided between the substrate 2 and the first dielectric film 41 as necessary. The interlayer such as the second dielectric film 42, a metal film, a metal oxide film, or a metal nitride film can improve adhesiveness therebetween.

A metal reflective film is preferably held on a surface of the multilayer reflective film 4. The surface of the multilayer reflective film 4 is a surface on the mounting substrate 8 side. FIG. 4 exemplifies the multilayer reflective film 4, the mounting substrate 8, and the metal reflective film 9. FIG. 4 illustrates a structure where the metal reflective film 9 is provided on the top surface of the multilayer reflective film 4 to be mounted on the mounting substrate 8.

The metal reflective film 9 can further improves the reflectivity. This can reduces the number of stacks of the multilayer reflective film 4. The metal reflective film 9 preferably contains at least one selected from the group consisting of Au, Ag, and Al as a major constituent. The major constituent indicates that a content thereof is 50% or more and 100% or less in mass ratio. Accordingly, examples of the constituent include an Au element, an Au alloy, an Ag element, an Ag alloy, an Al element, and an Al alloy. For example, an example of the Ag alloy includes an AgPdCu alloy. Among them, Ag, the Ag alloy, Al, and the Al alloy are preferable because each reflectivity at 380 to 430 nm is higher. They are also lower in price compared to Au.

The mounting substrate 8 is a substrate to mount the semiconductor light-emitting element 1. Accordingly, it is distinguished from the substrate 2 to grow the semiconductor layer 3. The mounting substrate 8 preferably has high reflectivity because it is necessary to efficiently reflect light emitted from the semiconductor layer 3. It is demanded to further increase luminance of a light-emitting device using the semiconductor light-emitting element 1. Since a high-output type light-emitting device has characteristics such that input power is large, a junction temperature becomes high, and so on, heat release performance of the mounting substrate is required to be high. An example of the mounting substrate 8 includes a metal substrate in consideration of the above-stated characteristics. An Al plate is preferable as the metal substrate. A ceramic substrate which is covered with silver (Ag), aluminum (Al) or aluminum oxide ($Al_2O_3$) is also effective. A silicon nitride substrate, an aluminum nitride substrate, and an aluminum oxide substrate are preferable as the ceramic substrate. The semiconductor light-emitting element 1 may be mounted on the mounting substrate 8 directly or with an adhesive layer therebetween.

The semiconductor light-emitting element as stated above has the emission peak wavelength of 395 to 425 nm, and the light-emission efficiency is improved because the reflectivity is improved owing to the multilayer reflective film.

An area of the semiconductor light-emitting element 1 is preferably 0.1 $mm^2$ or more. An area of the light-emitting element is an area of a semiconductor layer when the light-emitting element is seen from above. It is the area when the semiconductor layer 3 is seen from an upper direction in a case of FIG. 1.

Since the light-emission efficiency of the semiconductor light-emitting element according to the embodiment is improved, the light-emission efficiency increases even when an area of the element becomes large. When the element becomes large, manufacturing variance of the semiconductor layer 3 is likely to occur. What is called nonuniformity of a crystal layer or the like causes the manufacturing variance. The deviation of the emission peak thereby occurs. Since the reflectivity at 380 to 430 nm is improved owing to the multilayer reflective film 4, the reflectivity can be made high even if the emission peak deviates.

A full width at half maximum of the emission peak of the semiconductor light-emitting element 1 is preferably 10 nm or more. When the emission peak wavelength is from 395 nm to 425 nm and the full width at half maximum of the emission peak is 10 nm or more, there are the emission peaks in both the ultraviolet region and the visible light region. The reflectivities at both the ultraviolet region and the visible light region can be improved by forming the multilayer reflective film as stated above. Accordingly, it is effective for the light-emitting element whose full width at half maximum of the emission peak is 10 nm or more. An upper limit of the full width at half maximum of the emission peak is not particularly limited, but it is preferably 30 nm or less. When the full width at half maximum is large to exceed 30 nm, a ratio where a part of the emission peak is out of the range of 380 to 430 nm becomes large, and the reflection effect may become insufficient. It is also possible to apply to a light-emitting element such as a semiconductor laser without being limited to the light-emitting diode (LED).

Figure 5:
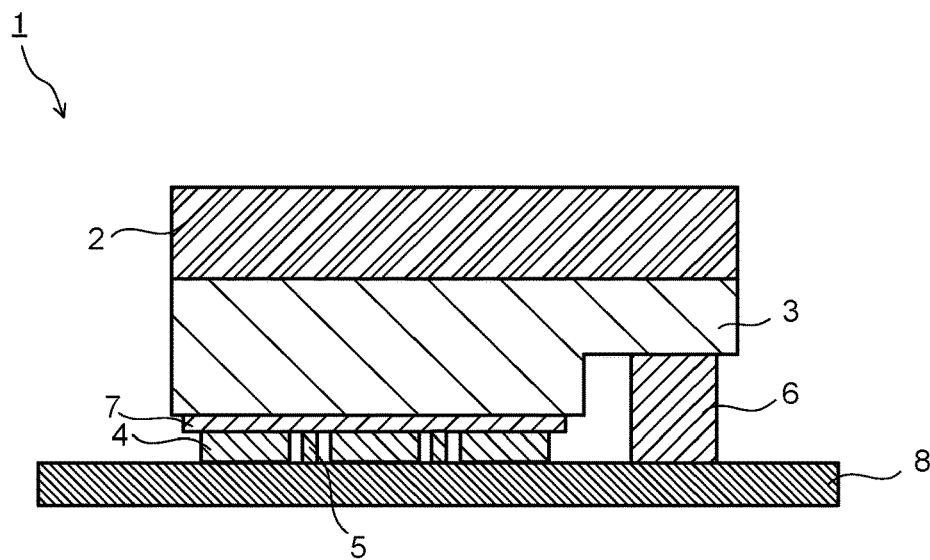
FIG. 5 is a cross-sectional schematic diagram illustrating still another structural example of the semiconductor light-emitting element.

The semiconductor light-emitting element according to the embodiment is also suitable for the flip-chip type element. FIG. 5 is a cross-sectional schematic diagram illustrating a structural example of a flip-chip type semiconductor light-emitting element. The semiconductor light-emitting element 1 illustrated in FIG. 5 includes the substrate 2, the semiconductor layer 3, the multilayer reflective film 4, the electrode 5 (the p-pad electrode), the electrode 6 (the n-pad electrode), the translucent electrode 7, and the mounting substrate 8. In FIG. 5, a stacked structure of the substrate 2/the semiconductor layer 3/the multilayer reflective film 4 is illustrated. FIG. 5 illustrates a structure where the electrode 5 is provided at each spacing between the multilayer reflective films 4. An electrode structure is not limited thereto, and the n-pad electrode and the p-pad electrode may be provided at required places. The translucent electrode 7, the metal reflective film 9, and so on may be provided as necessary. Regarding configurations of the substrate 2, the semiconductor layer 3, the multilayer reflective film 4, the electrode 5, the electrode 6, the translucent electrode 7, and the mounting substrate 8, the above-described explanation can be appropriately cited for the same part as the configuration of the face-up type semiconductor light-emitting element 1.

The semiconductor light-emitting element as stated above has the emission peak wavelength of 395 to 425 nm and high light-emission efficiency. Accordingly, it is suitable for an independent light-emitting element and a white light-emitting device combined with a phosphor. When the semiconductor light-emitting element is combined with the phosphor, it can be applied to a light-emitting device which emits objected visible light of blue, yellow, green, red, and so on without being limited to white. The phosphor emits light in a range of blue to red while using the wavelength in the range of 395 to 425 nm as an excitation source.

A blue phosphor is a phosphor having an emission peak wavelength of 450 nm or more and 520 nm or less. Examples of such a phosphor include a halophosphate phosphor, a phosphate phosphor, an alkaline-earth metal aluminate phosphor, and so on.

Examples of the halophosphate phosphor include (Sr, Ca, Ba, Mg)$_5$(PO$_4$)$_3$(Cl, Br):Eu, (Sr, Ca, Ba, Mg)$_5$(PO$_4$)$_3$Cl:Eu, and so on. An example of the phosphate phosphor includes 2SrO.0.84P$_2$O$_5$.0.16B$_2$O$_3$:Eu, and so on. Examples of the alkaline-earth metal aluminate phosphor include BaMgAl$_{10}$O$_{17}$:Eu, BaMg$_2$Al$_{16}$O$_{27}$:Eu, BaMgAl$_{10}$O$_{17}$:Eu, Mn, and so on.

The green phosphor and the yellow phosphor are phosphors each having a major emission peak at a wavelength region of 520 nm or more and 580 nm or less. Examples of such a phosphor include a silicate phosphor, an aluminate phosphor, a sulfide phosphor, an alkaline-earth oxynitride phosphor, and so on. Examples of the silicate phosphor include (Sr, Ca, Ba)$_2$SiO$_4$:Eu, Ca$_3$(Sc, Mg)$_2$Si$_3$O$_{12}$:Ce, and so on. An example of the aluminate phosphor includes (Y, Gd)$_3$(Al, Ga)$_5$O$_{12}$:Ce, and so on. An example of the sulfide phosphor includes (Ca, Sr, Ba)Ga$_2$S$_4$:Eu, and so on. Examples of the alkaline-earth oxynitride phosphor include (Ca, Sr, Ba)Si$_2$O$_2$N$_2$:Eu, (Ca, Sr)-αSiAlON:Eu, β-SiAlON: Eu, and so on.

The red phosphor is a phosphor having a major emission peak at a wavelength region from orange to red of 580 nm or more and 680 nm or less. Examples of the red phosphor include the silicate phosphor, an oxyfluoride phosphor, a fluoride phosphor, an oxide phosphor, an oxysulfide phosphor, the sulfide phosphor, a nitride phosphor, and so on.

An example of the silicate phosphor includes (Sr, Ca, Ba)$_2$SiO$_4$:Eu, and so on. An example of the oxyfluoride phosphor includes 3.5MgO.0.5MgF.GeO$_2$:Mn$^{4+}$, and so on. An example of the fluoride phosphor includes (Na, K, Rb, Cs)$_2$(Si, Ti, Ge)F:Mn$^{4+}$, and so on. An example of the oxide phosphor includes YVO$_4$:Eu, and so on. An example of the oxysulfide phosphor includes (La, Gd, Y)$_2$O$_2$S:Eu, and so on. An example of the sulfide phosphor includes (Ca, Sr, Ba)S:Eu, and so on. Examples of the nitride phosphor include (Sr, Ba, Ca)$_2$Si$_5$N$_8$:Eu, (Sr, Ca)AlSiN$_3$:Eu, and so on.

Various phosphors can be used as the phosphor without being limited to the above-stated phosphors. The light-emitting device can be used for various uses such as lighting and backlight.

Next, a manufacturing method of the semiconductor light-emitting element is explained. The manufacturing method is not particularly limited as long as the semiconductor light-emitting element according to the embodiment has the above-stated configuration, but the following method can be cited as a method to efficiently obtain the semiconductor light-emitting element.

First, the substrate 2 is prepared. The fine uneven surface is provided on the surface of the substrate 2 where the semiconductor layer 3 is to be provided. Examples of the substrate 2 include sapphire, SiC, GaN, and so on. The substrate 2 is fabricated by a sublimation method, a chemical vapor deposition method, and so on.

Next, the semiconductor layer 3 is provided on the surface having the structure with the fine uneven surface. A forming method of the semiconductor layer 3 is preferably a metal-organic vapor phase epitaxy (MOVPE) method. The MOVPE method is a method to form an objected semiconductor layer by making a plurality of organic metal gases react. Various semiconductor layers such as GaN, InGaN, AlGaN, InAlGaN can be formed. An example of the organic metal gas includes trimethylgallium (TMGa) or triethylgallium (TEGa) as a raw material of Ga. An example of a raw material of Al includes trimethylaluminum (TMAl), an example of a raw material of In includes trimethylindium (TMIn), and so on. The organic metal gas is supplied on the substrate 2 heated in the MOVPE apparatus, and the semiconductor layer can be sequentially grown. The buffer layer 31, the n-type layer 32, the active layer 33, and the p-type layer 34 can be respectively formed. A process of doping impurity elements may be performed as necessary.

After the semiconductor layer 3 is formed, the electrode 5 (the p-pad electrode) and the electrode 6 (the n-pad electrode) are formed. The translucent electrode 7 is formed on the semiconductor layer 3 as necessary. The electrode 5 and the electrode 6 can be formed by, for example, sputtering or electron beam (EB) evaporation. The translucent electrode 7 can be formed by, for example, the sputtering.

Next, the multilayer reflective film 4 is formed. In a case of the face-up type, the multilayer reflective film 4 is formed on the surface of the substrate 2 where the semiconductor layer 3 is not provided. At this time, grinding and polishing of the substrate 2 are performed as necessary to reduce a thickness and control roughness of the substrate 2, and then the multilayer reflective film 4 is formed. In a case of the flip-chip type, the multilayer reflective film 4 is formed on the semiconductor layer 3.

The multilayer reflective film 4 has a structure where the first dielectric films 41 and the second dielectric films 42 are alternately stacked. The multilayer reflective film 4 can be formed by, for example, a physical vapor deposition (PVD) method. Examples of the physical vapor deposition method include vacuum deposition, molecular beam epitaxy (MBE), ion plating, ion-beam deposition, the sputtering, and so on. Ion-beam-assisted deposition (IAD) is also effective. The IAD method irradiates gas ions using an ion gun during the vacuum deposition to form a dense film. It is also effective to scatter the same amount of electrons to neutralize when the gas ions are irradiated. A dense and flat multilayer film can be formed by using the IAD method.

The multilayer reflective film 4 is formed by providing the first dielectric film 41 on the substrate 2 side, and then the second dielectric films 42 and the first dielectric films 41 are alternately formed.

The metal reflective film 9 may be formed as necessary. The metal reflective film 9 can be formed by, for example, the sputtering method or the electron beam (EB) evaporation. A protection film which covers the semiconductor layer 3 or a whole of the semiconductor light-emitting element 1 may be formed as necessary.

Next, the semiconductor light-emitting element 1 is mounted on the mounting substrate 8. In a mounting process, an adhesive layer may be provided when adhesiveness between the multilayer reflective film 4 or the metal reflective film 9 and the mounting substrate 8 is insufficient.

EXAMPLES

Examples 1 to 7, Comparative Examples 1 to 2

A glass substrate was prepared as a mounting substrate. Each multilayer reflective film listed in Table 1 was formed on the glass substrate. Reflectivity of the formed reflective film was measured by using an ultraviolet-visible spectrophotometer (manufactured by Shimadzu Corporation UV-2600).

have the theoretical value $(d=\lambda p/(4 \times n))$ at a peak wavelength of 400 nm. The thickness variation is also suppressed to be zero. Comparative example 2 does not satisfy $20 \leq |\lambda 1 - \lambda 2|$.

Next, the reflectivity measurement of the reflective film was performed to measure reflectivity at each wavelength listed in Table 2. The measurement method was the same as that of Table 1. Results thereof are listed in Table 2.

TABLE 2

| | Reflectivity [%] | | | |
|---|---|---|---|---|
| | Wavelength 380 nm | Wavelength 400 nm | Wavelength 420 nm | Wavelength 430 nm |
| Example 1 | 80% | 94% | 95% | 83% |
| Example 2 | 80% | 97% | 97% | 85% |
| Example 3 | 84% | 98% | 97% | 85% |
| Example 4 | 80% | 97% | 97% | 84% |
| Example 5 | 84% | 98% | 96% | 80% |
| Example 6 | 82% | 97% | 96% | 81% |
| Example 7 | 81% | 95% | 96% | 83% |
| Comparative example 1 | 78% | 95% | 83% | 71% |
| Comparative example 2 | 79% | 94% | 87% | 78% |

The table shows that the multilayer reflective film according to each of the examples had the reflectivity of 80% or more and 100% or less at the wavelength range of 380 to 430 nm. The maximum reflectivity was over 95%. It can be seen

TABLE 1

| | First dielectric film | | | | Second dielectric film | | | | |
|---|---|---|---|---|---|---|---|---|---|
| | Material (Refractive index) | λ1 [nm] | Film thickness [nm] | Film thickness variation [nm] | Material (Refractive index) | λ2 [nm] | Film thickness [nm] | Film thickness variation [nm] | Number of stacks |
| Example 1 | Nb$_2$O$_3$ (2.5) | 427 | 42.4 | ±3.8 | MgF$_2$ (1.39) | 393 | 69.4 | ±1.4 | 5 |
| Example 2 | ZrO$_2$ (2.27) | 414 | 45.8 | ±3.2 | CaF$_2$ (1.44) | 388 | 67.8 | ±1.8 | 10 |
| Example 3 | ZrO$_2$ (2.27) | 423 | 46.6 | ±3.2 | SiO$_2$ (1.47) | 384 | 64.8 | ±0.9 | 15 |
| Example 4 | Ta$_2$O$_5$ (2.2) | 421 | 47.8 | ±3.6 | SiO$_2$ (1.47) | 396 | 66.1 | ±1.1 | 20 |
| Example 5 | Si$_3$N$_4$ (2.07) | 383 | 47.2 | ±3.9 | SiO$_2$ (1.47) | 409 | 72.1 | ±1.2 | 20 |
| Example 6 | TiO$_2$ (3.28) | 419 | 31.9 | ±2.8 | SiO$_2$ (1.47) | 393 | 67.1 | ±1.2 | 15 |
| Example 7 | ZrO$_2$ (2.27) | 423 | 46.6 | +3.2 to −1.5 | SiO$_2$ (1.47) | 388 | 64.8 | ±0.9 | 10 |
| Comparative example 1 | ZrO$_2$ (2.27) | 400 | 44.1 | 0 | SiO$_2$ (1.47) | 400 | 68.0 | 0 | 5 |
| Comparative example 2 | ZrO$_2$ (2.27) | 404 | 44.5 | ±3.6 | SiO$_2$ (1.47) | 398 | 67.7 | ±0.9 | 5 |

Refractive indexes listed in Table 1 are the refractive indexes at around 390 to 430 nm. The multilayer reflective films of Examples 1 to 7 listed in Table 1 each satisfy the following relations.

$$0.9(\lambda 1/(4 \times n1)) \leq d1 \leq 1.1(\lambda 1/(4 \times n1)),$$

$$0.9(\lambda 2/(4 \times n2)) \leq d2 \leq 1.1(\lambda 2/(4 \times n2)),$$

$$n1 > n2,$$

$$20 \leq |\lambda 1 - \lambda 2|, 380 \leq \lambda 1 \leq 430, \text{ and } 380 \leq \lambda 2 \leq 430$$

Figure 6:
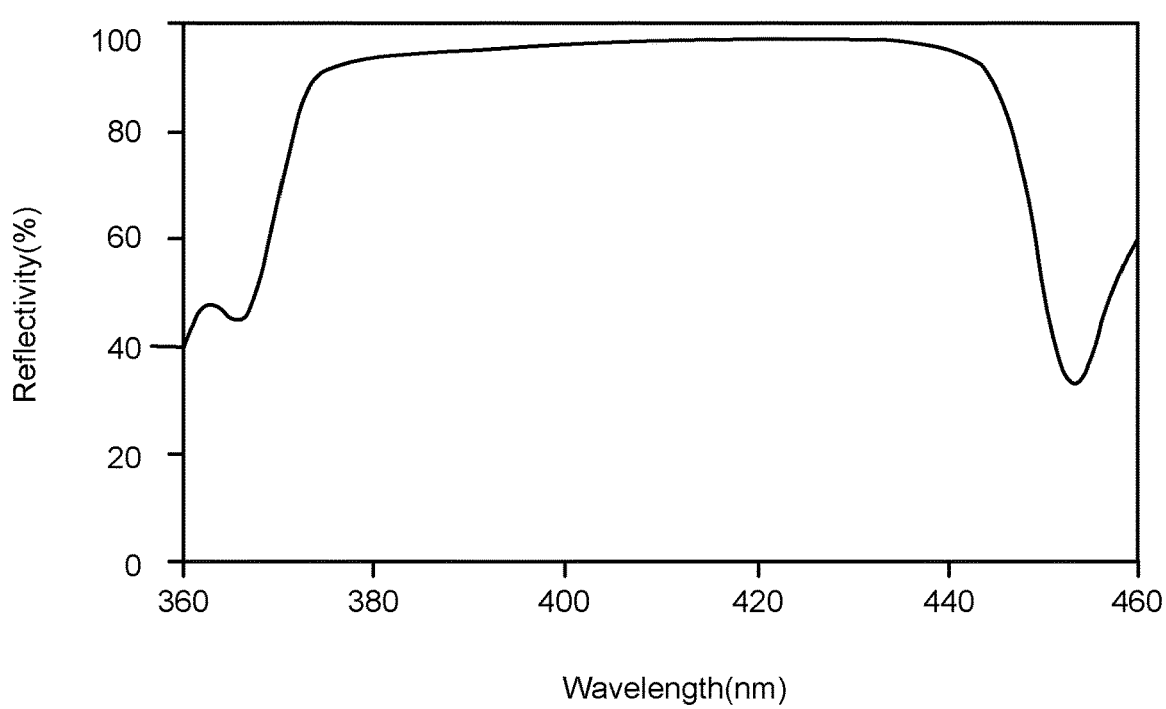
FIG. 6 is a diagram illustrating reflectivity of the multilayer reflective film.

Comparative example 1 is an example where both the first dielectric film and the second dielectric film are designed to from the above that the reflectivity is high even if the emission peak wavelength deviates. FIG. 6 illustrates the reflectivity in a wavelength range of 360 nm to 460 nm of Example 3. Meanwhile, in each of Comparative example 1 and Comparative example 2, excellent reflectivity was exerted at the peak wavelength of 400 nm, but the reflectivity was lowered at other wavelengths.

Next, each metal reflective film listed in Table 3 was provided on a top surface of the multilayer reflective film according to each of the examples and the comparative examples. Reflectivity was measured by a similar method as that of Table 1. Results thereof are listed in Table 4.

TABLE 3

|  | Multilayer reflective film | Metal reflective film Material | Thickness (nm) |
|---|---|---|---|
| Example 8 | Example 1 | AgPdCu | 290 |
| Example 9 | Example 2 | Ag | 240 |
| Example 10 | Example 3 | AgPdCu | 280 |
| Example 11 | Example 4 | Al | 280 |
| Example 12 | Example 5 | AgPdCu | 270 |
| Example 13 | Example 6 | Ag | 260 |
| Example 14 | Example 7 | AgPdCu | 260 |
| Comparative example 3 | Comparative example 1 | Au | 290 |
| Comparative example 4 | Comparative example 2 | Al | 290 |

TABLE 4

|  | Reflectivity [%] | | | |
|---|---|---|---|---|
|  | Wavelength 380 nm | Wavelength 400 nm | Wavelength 420 nm | Wavelength 430 nm |
| Example 8 | 92% | 100% | 100% | 95% |
| Example 9 | 92% | 100% | 100% | 98% |
| Example 10 | 95% | 100% | 100% | 97% |
| Example 11 | 92% | 100% | 100% | 96% |
| Example 12 | 96% | 100% | 100% | 93% |
| Example 13 | 93% | 100% | 100% | 95% |
| Example 14 | 94% | 100% | 100% | 95% |
| Comparative example 3 | 86% | 100% | 96% | 85% |
| Comparative example 4 | 88% | 100% | 98% | 91% |

The table shows that the reflectivity of each of the multilayer reflective films according to the examples was improved to be 92% or more and 100% or less. The maximum reflectivity was 100%. Meanwhile, in each of Comparative example 3 and Comparative example 4, an effect better than the above could not be obtained even when the metal reflective film was provided.

Examples 15 to 28, Comparative Examples 5, 6

The PSS was used as a sapphire substrate, and fine uneven surface is provided. A semiconductor layer was provided thereon. A semiconductor light-emitting element was fabricated by providing electrodes and a translucent electrode. Areas of respective semiconductor light-emitting elements are listed in Table 5. The area of the semiconductor light-emitting element was an area when a light-emitting layer was seen from above. A multilayer reflective film of each of Examples 1 to 14, Comparative examples 3, 4 was provided at the sapphire substrate of the fabricated semiconductor light-emitting element on a side opposite to the semiconductor light-emitting element. Light-emission efficiency was found for each of the fabricated semiconductor light-emitting elements. A measurement method of the light-emission efficiency was as described below. The fabricated semiconductor light-emitting element was cut into the area listed in Table 5, it was fixed on a mounting substrate by using silver paste, solder, transparent adhesive, and so on, and continuity with the mounting substrate was secured by using gold wires or the like. Total luminous flux measurement was performed for the mounted semiconductor light-emitting element by using a total luminous flux measurement system (manufactured by Otsuka Electronics Co., Ltd. MCPD9800) having an integrating sphere, and external quantum efficiency of the semiconductor light-emitting element was calculated from the obtained result.

Light emission intensities of the respective semiconductor light-emitting elements were compared. The comparison was shown as a relative efficiency value when the external quantum efficiency of the semiconductor light-emitting element of Comparative example 5 was set as 100. Semiconductor light-emitting elements each having a peak wavelength of 400 nm±5 nm (full width at half maximum of 15 nm±3 nm) and a peak wavelength of 415 nm±10 nm (full width at half maximum of 15 nm±3 nm) were used as the semiconductor light-emitting elements. Results are listed in Table 5.

TABLE 5

|  | Multilayer reflective film and Metal reflective film | Area of semiconductor light-emitting element [mm$^2$] | Relative efficiency (400 nm) | Relative efficiency (415 nm) |
|---|---|---|---|---|
| Example 15 | Example 1 | 0.18 | 110 | 126 |
| Example 16 | Example 2 | 0.18 | 111 | 127 |
| Example 17 | Example 3 | 0.18 | 112 | 127 |
| Example 18 | Example 4 | 0.18 | 111 | 127 |
| Example 19 | Example 5 | 0.37 | 112 | 126 |
| Example 20 | Example 6 | 0.18 | 111 | 127 |
| Example 21 | Example 7 | 0.18 | 110 | 125 |
| Example 22 | Example 8 | 0.18 | 113 | 130 |
| Example 23 | Example 9 | 0.18 | 114 | 132 |
| Example 24 | Example 10 | 0.18 | 114 | 131 |
| Example 25 | Example 11 | 0.18 | 115 | 131 |
| Example 26 | Example 12 | 0.37 | 115 | 130 |
| Example 27 | Example 13 | 0.18 | 114 | 131 |
| Example 28 | Example 14 | 0.18 | 112 | 129 |
| Comparative example 5 | Comparative example 3 | 0.18 | 100 | 100 |
| Comparative example 6 | Comparative example 4 | 0.18 | 107 | 117 |

As can be seen from the table, the light-emission efficiencies of the semiconductor light-emitting elements according to the examples were improved. Meanwhile, the semiconductor light-emitting elements of the comparative examples were not improved. It turned out that the improvement of the multilayer reflective film was effective for the improvement of the light-emission efficiency. It was effective even when the element became large.

Examples 15A to 28A, Comparative Examples 5A, 6A

White light-emitting devices of Examples 15A to 28A, Comparative examples 5A, 6A were fabricated by combining the semiconductor light-emitting elements of Examples 15 to 28, Comparative examples 5, 6 with phosphors. A halophosphate phosphor (peak wavelength of 480 nm) as a blue phosphor, a silicate phosphor (peak wavelength of 560 nm) as a green phosphor, and a nitride phosphor (peak wavelength of 620 nm) as a red phosphor were used as the phosphors. Three kinds of phosphors were mixed into a resin, coated on the semiconductor light-emitting element, and dried to be the white light-emitting device. Total luminous flux was measured for each light-emitting device. The measurement of the total luminous flux was performed by a similar method as Example 15. Results are shown by relative efficiency when the light-emission efficiency of Comparative example 5A is set as 100. Results are listed in Table 6.

TABLE 6

|  | Semiconductor light-emitting element | Relative efficiency |
|---|---|---|
| Example 15A | Example 15 | 108 |
| Example 16A | Example 16 | 113 |
| Example 17A | Example 17 | 115 |
| Example 18A | Example 18 | 110 |
| Example 19A | Example 19 | 114 |
| Example 20A | Example 20 | 111 |
| Example 21A | Example 21 | 107 |
| Example 22A | Example 22 | 113 |
| Example 23A | Example 23 | 113 |
| Example 24A | Example 24 | 112 |
| Example 25A | Example 25 | 117 |
| Example 26A | Example 26 | 116 |
| Example 27A | Example 27 | 115 |
| Example 28A | Example 28 | 113 |
| Comparative example 5A | Comparative example 5 | 100 |
| Comparative example 6A | Comparative example 6 | 105 |

As can be seen from the table, the light-emission efficiencies of the light-emitting devices according to the examples were improved. It is indicated that the improvement of the performance of the semiconductor light-emitting element causes the improvement of the performance of the light-emitting device.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The above-stated respective embodiments can be embodied by combining with each other.

What is claimed is:

1. A semiconductor light emitting element, comprising:
a substrate including a first surface and a second surface, at least one surface selected from the group consisting of the first and second surfaces having an uneven region;
a semiconductor layer on the first surface; and
a multilayer reflective film on the second surface or the semiconductor layer, wherein
the multilayer reflective film includes a structure having a plurality of first dielectric films and a plurality of second dielectric films, the first dielectric films and the second dielectric films being alternately stacked,
one of the first dielectric films and one of the second dielectric films satisfy $0.9(\lambda 1/(4 \times n1)) \leq d1 \leq 1.1(\lambda 1/(4 \times n1))$  A formula 1:

$0.9(\lambda 2/(4 \times n2)) \leq d2 \leq 1.1(\lambda 2/(4 \times n2))$  A formula 2:

$n1 > n2$  A formula 3:

$20 \leq |\lambda 1 - \lambda 2|$  A formula 4:

$380 \leq \lambda 1 \leq 430$  A formula 5:

$380 \leq \lambda 2 \leq 430$  A formula 6:

where d1 represents a thickness (nm) of the one of the first dielectric films,
n1 represents a refractive index of the one of the first dielectric films,
d2 represents a thickness (nm) of the one of the second dielectric films,
n2 represents a refractive index of the one of the second dielectric films,
λ1 represents a first wavelength (nm) in a wavelength range of 380 nm or more and 430 nm or less, and
λ2 represents a second wavelength (nm) in the wavelength range,
wherein
a thickness of another one of the first dielectric films is different from a value of d1 defined by a formula 7:
$d1 = \lambda p/(4 \times n1)$
where d1 represents the thickness (nm) of the one of the first dielectric films, n1 represents the refractive index of the one of the first dielectric films, and λp represents the emission peak wavelength of the semiconductor light-emitting element,
the difference there between being 1 nm or more,
wherein a full width at half maximum of the emission peak is 10 nm or more,
wherein the emission peak wavelength is 395 nm or more and 425 nm or less.

2. The element according to claim 1, wherein the element is a face-up element.

3. The element according to claim 1, wherein
the first dielectric films contain at least one selected from the group consisting of titanium oxide, zirconium oxide, silicon nitride, niobium oxide, and tantalum oxide.

4. The element according to claim 1, wherein
the second dielectric films contain at least one selected from the group consisting of silicon oxide, magnesium fluoride, and calcium fluoride.

5. The element according to claim 1, wherein
the number of the first dielectric films is three or more, and
the number of the second dielectric films is three or more.

6. The element according to claim 1, further comprising:
a metal reflective film provided on the multilayer reflective film.

7. The element according to claim 6, wherein
the metal reflective film contains at least one element selected from the group consisting of Au, Ag, and Al.

8. The element according to claim 1, wherein
the element has an area of 0.1 mm$^2$ or more.

9. The element according to claim 1, wherein a full width at half maximum of the emission peak is 10 nm or more.

10. The element according to claim 1, wherein
a thickness of another one of the second dielectric films is different from a value of d2 defined by a formula 8:
$d2 = \lambda p/(4 \times n2)$
where d2 represents the thickness (nm) of the one of the second dielectric films, n2 represents the refractive index of the one of the second dielectric films, and λp represents the emission peak wavelength,
the difference therebetween being 1 nm or more.

11. The element according to claim 1, wherein
the first dielectric films contain at least one selected from the group consisting of titanium oxide, zirconium oxide, silicon nitride, niobium oxide, and tantalum oxide.

12. The element according to claim 1, wherein
the second dielectric films contain at least one selected from the group consisting of silicon oxide, magnesium fluoride, and calcium fluoride.

13. The element according to claim 1, wherein
the number of the first dielectric films is three or more, and
the number of the second dielectric films is three or more.

14. The element according to claim 1, further comprising:
a metal reflective film provided on the multilayer reflective film.

15. The element according to claim 14, wherein
the metal reflective film contains at least one element selected from the group consisting of Au, Ag, and Al.

16. The element according to claim 1, wherein
the element has an area of 0.1 mm² or more.

17. A semiconductor light-emitting element, comprising:
a substrate including a first surface and a second surface, at least one surface selected from the group consisting of the first and second surfaces having an uneven region;
a semiconductor layer on the first surface; and
a multilayer reflective film on the second surface or the semiconductor layer, wherein
the multilayer reflective film includes a structure having a plurality of first dielectric films and a plurality of second dielectric films, the first dielectric films and the second dielectric films being alternately stacked,
one of the first dielectric films and one of the second dielectric films satisfy $$0.9(\lambda 1/(4 \times n1)) \leq d1 \leq 1.1(\lambda 1/(4 \times n1)) \quad \text{A formula 1:}$$

$$0.9(\lambda 2/(4 \times n2)) \leq d2 \leq 1.1(\lambda 2/(4 \times n2)) \quad \text{A formula 2:}$$

$$n1 > n2 \quad \text{A formula 3:}$$

$$20 \leq |\lambda 1 - \lambda 2| \quad \text{A formula 4:}$$

$$380 \leq \lambda 1 \leq 430 \quad \text{A formula 5:}$$

$$380 \leq \lambda 2 \leq 430 \quad \text{A formula 6:}$$

where d1 represents a thickness (nm) of the one of the first dielectric films,
n1 represents a refractive index of the one of the first dielectric films,
d2 represents a thickness (nm) of the one of the second dielectric films,
n2 represents a refractive index of the one of the second dielectric films,
λ1 represents a first wavelength (nm) in a wavelength range of 380 nm or more and 430 nm or less, and
λ2 represents a second wavelength (nm) in the wavelength range,
wherein
a thickness of another one of the first dielectric films is different from a value of d1 defined by a formula 7:
d1=λp/(4×n1)
where d1 represents the thickness (nm) of the one of the first dielectric films, n1 represents the refractive index of the one of the first dielectric films, and λp represents the emission peak wavelength of the semiconductor light-emitting element,
the difference there between being 1 nm or more,
wherein a full width at half maximum of the emission peak is 10 nm or more,
wherein the emission peak wavelength is 395 nm or more and 425 nm or less.

* * * * *